United States Patent [19]
Yung

[11] Patent Number: 5,293,006
[45] Date of Patent: Mar. 8, 1994

[54] SOLDER BUMP INCLUDING CIRCULAR LIP

[75] Inventor: Edward K. Yung, Carrboro, N.C.

[73] Assignee: MCNC, Research Triangle Park, N.C.

[21] Appl. No.: 927,069

[22] Filed: Aug. 7, 1992

Related U.S. Application Data

[62] Division of Ser. No. 759,450, Sep. 13, 1991, Pat. No. 5,162,257.

[51] Int. Cl.$^5$ .............................................. H05K 1/00
[52] U.S. Cl. .................................. 174/261; 174/259; 228/180.1
[58] Field of Search ............... 174/257, 259, 260, 261; 228/180.1; 361/403, 404, 418

[56] References Cited

U.S. PATENT DOCUMENTS

| | | |
|---|---|---|
| 3,986,255 | 10/1976 | Mandal . |
| 4,273,859 | 6/1981 | Mones et al. . |
| 4,733,813 | 3/1988 | Le Meau et al. . |
| 4,752,027 | 6/1988 | Gschwend . |
| 4,763,829 | 8/1988 | Sherry . |
| 4,783,722 | 11/1988 | Osaki et al. . |
| 4,817,850 | 4/1989 | Wiener-Avenear et al. . |
| 4,830,264 | 5/1989 | Bitaillou et al. . |
| 4,840,302 | 6/1989 | Gardner et al. . |
| 4,878,611 | 2/1989 | LoVasco et al. . |
| 4,893,403 | 1/1990 | Heflinger et al. . |
| 4,897,918 | 2/1990 | Osaka et al. . |
| 4,931,410 | 6/1990 | Tokanaga et al. . |
| 4,940,181 | 7/1990 | Juskey, Jr. et al. . |
| 4,950,623 | 8/1990 | Dishon . |
| 5,024,372 | 6/1991 | Altman et al. . |
| 5,152,451 | 10/1992 | Derveaux et al. . |
| 5,154,341 | 10/1992 | Melton et al. . |

FOREIGN PATENT DOCUMENTS 54-128669 of 0000 Japan .

OTHER PUBLICATIONS

*Electroplated Solder Joints for Flip-Chip Applications*, E. K. Yung et al., Transactions on Components, Hybrids, and Manufacturing Technology, vol. 14, No. 3, Sep. 1991, pp. 549-559.
*Flip-Chip Process Utilizing Electroplated Solder Joints*, E. K. Yung et al., Proceedings of the Technical Conference, 1990 International Electronics Packaging Conference, Sep. 10-12, 1990, pp. 1065-1079.
*Process Considerations in Fabricating Thin Film Multichip Modules*, T. G. Tessier et al., Proceedings of the Technical Conference, 1989 International Electronics Packaging Conference, 1989.
PCT International Search Report dated Dec. 9, 1992 of International Appln. No. PCT/US 92/07722 filed Sep. 11, 1992.

*Primary Examiner*—Leo P. Picard
*Assistant Examiner*—Cheryl R. Figlin
*Attorney, Agent, or Firm*—Bell, Seltzer, Park & Gibson

[57] ABSTRACT

The base of solder bumps is preserved by converting the under-bump metallurgy between the solder bump and contact pad into an intermetallic of the solder and the solderable component of the under-bump metallurgy prior to etching the under-bump metallurgy. The intermetallic is resistant to etchants which are used to etch the under-bump metallurgy between the contact pads. Accordingly, minimal undercutting of the solder bumps is produced, and the base size is preserved. The solder may be plated on the under-bump metallurgy over the contact pad through a patterned solder dam layer having a solder accumulation region thereon. The solder dam is preferably a thin film layer which may be accurately aligned to the underlying contact pad to confine the wetting of the molten solder during reflow. Misalignment between the solder bump and contact pad is thereby reduced. The solder bumps so formed include an intermetallic layer which extends beyond the bump to form a lip around the base of the bump. This lip provides extra protection for the solder bump.

7 Claims, 2 Drawing Sheets

SOLDER BUMP INCLUDING CIRCULAR LIP

This application is a divisional of application Ser. No. 07/759,450, filed Sept. 13, 1991 now U.S. Pat. No. 5,162,257

FIELD OF THE INVENTION

This invention relates to interconnection systems for microelectronic substrates, and more particularly to solder bump interconnection systems for microelectronic substrates.

BACKGROUND OF THE INVENTION

High performance microelectronic devices often use solder balls or solder bumps for electrical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection—C4" or "flip-chip" technology, and will be referred to herein as "solder bumps".

In the original solder bump technology developed by IBM, the solder bumps are formed by evaporation through openings in a shadow mask which is clamped to an integrated circuit wafer. Solder bump technology based on a electroplating process has also been actively pursued, particularly for larger substrates and smaller bumps. In this process, an "under-bump metallurgy" (UBM) is deposited on a microelectronic substrate having contact pads thereon, typically by evaporation or sputtering. A continuous under-bump metallurgy film is typically provided on the pads and on the substrate between the pads, in order to allow current flow during solder plating.

In order to define the sites for solder bump formation over the contact pads, the sites of the solder bumps are photolithographically patterned, by depositing a thick layer of photoresist on the under-bump metallurgy and patterning the photoresist to expose the under-bump metallurgy over the contact pads. Solder pads are then formed on the exposed areas of the under-bump metallurgy, over the contact pads, by pattern electroplating. The plated solder accumulates in the cavities of the photoresist, over the contact pads. Then, the under-bump metallurgy between the plated solder pads is etched, using the solder as an etch mask, to break the electrical connection between the solder bumps. The photolithographic patterning and under-bump metallurgy etching steps define the geometry of the under-bump metallurgy at the base of the solder bump, between the solder bump and the contact pad. Solder bump fabrication methods are described in U.S. Pat. Nos. 4,950,623 to Dishon, assigned to the assignee of the present invention; 4,940,181 to Juskey, Jr. et al.; and 4,763,829 to Sherry.

Unfortunately, in fabricating solder bumps using the process described above, it is difficult to preserve the base of the solder bump, at the contact pad. Preservation of the base is important because the base of the solder bump is designed to seal the contact pad. The process described above often reduces the base, which exposes the underlying contact pad and leads to mechanical and/or electrical failure.

The base may be reduced due to at least two steps in the above described process. First, there is often an inherent distortion of the patterned thick film photoresist layer, and misalignment with respect to the contact pads lying thereunder. Typically, a dry thick film photoresist (such as du Pont RISTON® photoresist) or multiple coatings of liquid photoresist is used, in order to accumulate sufficient volume of plated solder. Thicknesses on the order of tens of microns (for example 50 microns) are used. The thick film photoresist must be accurately patterned over the contact pads, without misalignment or distortion.

Unfortunately, for dry film photoresist, distortion of the shape of bump sites may result from the relatively poor adhesion of the photoresist to the smooth underbump metallurgy. Light scattering through the thick film photoresist and cover layer, and the imprecise nature of the thick film photoresist development process, also contribute to distortion of the photoresist mask pattern over the contact pads. For multiple-layer liquid photoresist, factors such as hardening of photoresist due to long periods of baking, and edge bead build-up, may cause distortion in the photoresist mask pattern over the contact pads. Accordingly, the resultant solder bump often does not cover the entire contact pad.

The second major factor which may reduce the solder bump base is undercutting during chemical etching of the under-bump metallurgy. In particular, as described above, the under-bump metallurgy is typically etched, between the solder bumps, in order to break the electrical connections therebetween. In order to insure that all of the unwanted under-bump metallurgy is removed, overetching typically needs to be practiced, because etching frequently does not proceed uniformly across the substrate surface. However, this overetching typically undercuts the under-bump metallurgy between the solder bump and the contact pad, which reduces the solder bump base. Electrical and mechanical reliability of the solder bump connection is thereby degraded.

SUMMARY OF THE INVENTION

It is therefore an object of the present invention to provide an improved method of forming solder bumps for microelectronic device connections, and improved solder bumps formed thereby.

It is another object of the present invention to provide a method of preserving the base of solder bumps during their formation.

It is yet another object of the present invention to reduce undercutting of the solder bump base during formation.

It is still another object of the present invention to reduce misalignment between the solder bump and the underlying contact pad.

These and other objects are provided, according to the present invention by reflowing or melting the solder pads prior to etching the under-bump metallurgy between the solder pads. An intermetallic layer of the under-bump metallurgy and the solder is thus formed between the solder bump and the contact pad, at the base of the solder bump, prior to etching the under-bump metallurgy. Accordingly, at least part of the under-bump metallurgy layer between the solder bump and contact pad is converted to an intermetallic of the solder and the under-bump metallurgy, prior to etching the under-bump metallurgy. Preferably, when the under-bump metallurgy includes a top layer of copper, and lead-tin solder is used, substantially all of the top copper layer is converted to an intermetallic of copper and tin.

The intermetallic layer is resistant to etchants which are used to etch the under-bump metallurgy. The under-bump metallurgy may therefore be removed between the contact pads, while preserving the intermetallic layer at the base of the solder bump. Accordingly, minimal undercutting of the solder bumps is produced so that the base size is preserved and the contact pads are not exposed. Electrical and mechanical reliability of the solder bump connection is thereby enhanced.

The invention also reduces misalignment between the solder pads and its underlying contact pads, and tolerates distortion in patterning the solder accumulation layer. In particular, a continuous under-bump metallurgy is formed on the contact pads and on the microelectronic substrate between the contact pads. Solder dams are then formed on the under-bump metallurgy between the contact pads such that the solder dams expose the under-bump metallurgy over the contact pads. The exposed under-bump metallurgy over the contact pads define the location of the solder bump base. During reflow, the solder will retract or spread to these areas.

The solder dams, also referred to as solder stops, are preferably formed from a thin film layer (on the order of 1 micron or less) such as a thin film of chromium (on the order of 1500Å thick), which adheres well to the under-bump metallurgy. The solder dams are precisely aligned to the underlying contact pads using known integrated circuit photolithography. The solder dams are preferably patterned using the lift-off technique. Other photolithographic techniques may be used to pattern the solder dams.

Solder accumulation regions are then formed on the solder dams. These regions, which may be thick film (on the order of 50 microns) photoresist regions, need only accumulate solder volume. They need not be used for alignment purposes, because the solder dams provide precise alignment. Accordingly, misalignment and distortion of the thick film solder accumulation regions will not reduce the base of the solder bump over the contact pads. Solder pads are then electroplated onto the substrate over the contact pads, on the areas of the under-bump metallurgy which are exposed by the solder dams and solder accumulation regions. The solder accumulation regions may then be removed.

Then, prior to removing the under-bump metallurgy between the contact pads, the solder is reflowed (melted) to form a solder bump having an intermetallic layer of the solder and the under-bump metallurgy at the base of the solder bump adjacent the contact pad. For example, when the topmost component of the under-bump metallurgy is copper and conventional lead/tin solder is used, a copper/tin intermetallic is typically formed. During reflow, the solder dams prevent lateral spread and bridging of the solder, and control the size of the bump base.

The solder dams and under-bump metallurgy are then etched to isolate the solder bumps, using at least one etchant which etches the intermetallic layer more slowly than the solder bumps and under-bump metallurgy. Since the intermetallic has been formed at the base of the solder bumps, the bumps are relatively unaffected by the etchant. In particular, a mixture of ammonium hydroxide with trace amounts of hydrogen peroxide may be used to etch copper, and a hydrochloric acid based etchant may be used to etch chromium. Neither of these etchants is effective against the copper/tin intermetallic.

The base of the solder bumps formed according to the present invention is not reduced by under-bump metallurgy etching or solder pad misalignment/distortion. By preserving the base geometry, mechanical and electrical reliability is enhanced.

Moreover, it has been found that there is a lateral reaction between the solder pad and the under-bump metallurgy during the reflow step of the present invention. Accordingly, the intermetallic layer formed at the base of each solder bump extends beyond the bump to form a lip around the base of the solder bump. This lip provides extra protection for the edge of the solder bump and the edge of the contact pad underneath the solder bump. Accordingly, the invention produces a new profile of solder bump, which improves mechanical and electrical reliability.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
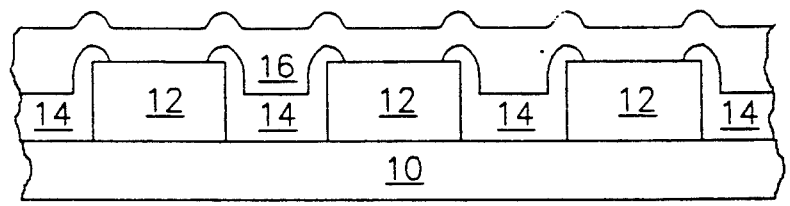
FIGS. 1–5 illustrate cross-sectional views of a microelectronic substrate during fabrication of solder bumps thereon according to the present invention.

Referring now to FIG. 1, there is illustrated a microelectronic substrate 10 having a plurality of contact pads 12 thereon. It will be understood by those having skill in the art that microelectronic substrate 10 may be an integrated circuit chip, a circuit board or microelectronic packaging substrate, or any other substrate which requires electrical and mechanical connection. Contact pads 12 are formed on substrate 10 using well known techniques which need not be described herein. The contact pads are typically aluminum for integrated circuit chips, although other metals and metal composites may also be used for integrated circuit chips and other substrates.

As also shown in FIG. 1, a passivating dielectric 14 is formed on the substrate 10 and patterned to expose the contact pads 12, using conventional plasma or reactive ion etching or other well known patterning techniques. A continuous under-bump metallurgy 16 is then formed on the substrate over the contact pads 12 and between the contact pads 12. As is well known to those having skill in the art, the under-bump metallurgy 16 typically contains a (bottom) chromium layer (about 1000Å thick) adjacent substrate 10 and pads 12, which functions as an adhesion layer and diffusion barrier for the under-bump metallurgy. A top copper layer (about 1 micron thick) is typically provided to act as a solderable metal, and a phased chromium/copper layer (about 1000 Å thick) is formed between the chromium and copper layers. The under-bump metallurgy may be formed by conventional thin film deposition techniques such as evaporation or sputtering, and need not be described further herein.

Figure 2:
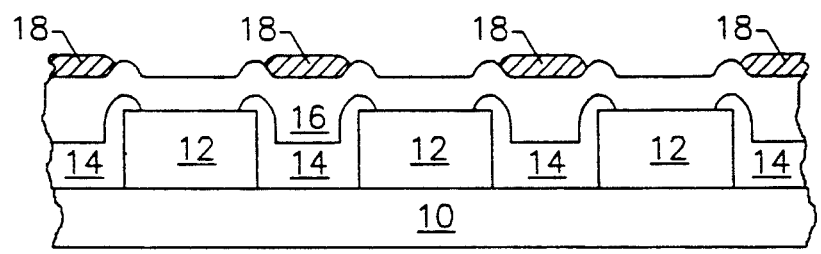

Referring now to FIG. 2, a solder dam or solder stop layer 18 is formed on the under-bump metallurgy layer 16 between the contact pads 10, exposing the under-bump metallurgy layer over the pads 12. Solder dam layer 18 is preferably a thin film, which does not wet with solder. Chromium or titanium solder dams on the order of 1500 Å thick, may be used. Solder dam layer 18 is preferably formed by depositing a continuous solder dam layer 18 and patterning using lift-off or etch techniques. The thin film may be patterned with reduced misalignment and distortion, compared to thick film photoresist, by using integrated circuit photolithography, because of reduced light scattering, better adhesion and more precise developing. Improved alignment between the gaps in solder dam layer 18 where the solder bumps will be anchored, and the connector pads 12 thereunder, may be obtained by using a lift-off technique to remove the solder dam layer over pads 12.

Figure 3:
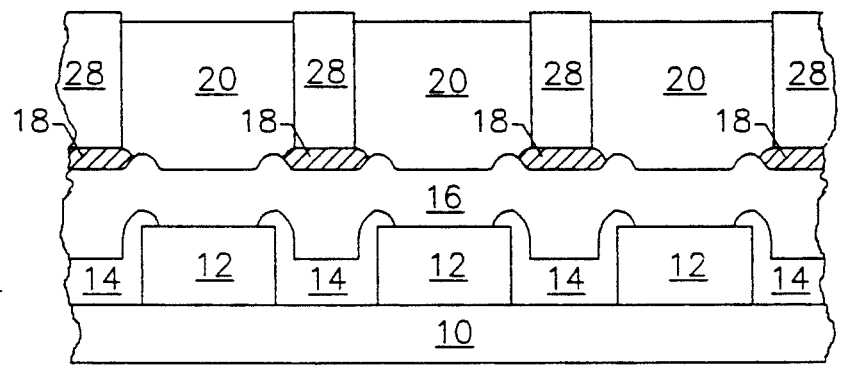

Referring now to FIG. 3, solder accumulation regions 28 are formed on solder dams 18. These regions may be thick film photoresist. Since solder accumulation regions are used to accumulate solder volume, and need not be used for alignment relative to contact pads 12, their imprecise alignment and distorted shape will not reduce the base of the solder bumps.

Still referring to FIG. 3, solder pads 20 are then formed on substrate 10, typically by electroplating. Volume is acquired by filling the spaces in solder accumulation regions 28 during plating. The solder pads 20 may be confined within the gaps in the solder dam layer 18 or may be allowed to extend over the solder dams, as is illustrated in FIG. 3. The solder accumulation regions 28 may then be removed.

Figure 4:
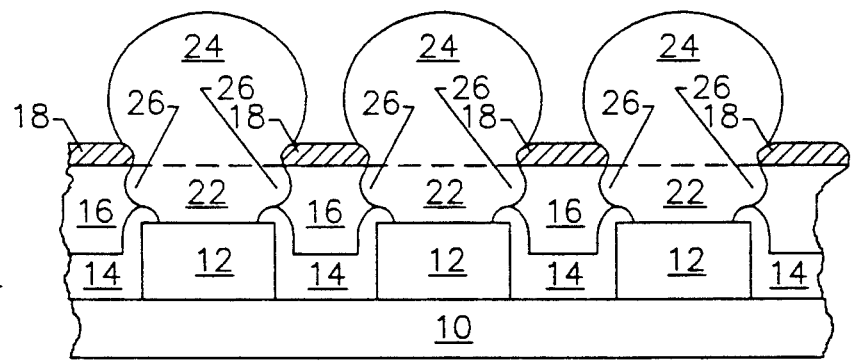

Referring now to FIG. 4, solder pads 20 are reflowed prior to removing the under-bump metallurgy layer 16 between the contact pads 12, to form an intermetallic layer 22 at the base of each solder bump 24. When the topmost component of the under-bump metallurgy layer is copper (about 1 micron thick) and conventional lead-tin solder (5 weight percent tin) is used, the intermetallic 22 which forms is Cu3Sn. It will be understood by those having skill in the art that a thin layer of the under-bump metallurgy 16, typically the bottom chromium layer and the phased chromium-copper layer (not shown in FIG. 4) may remain on contact pad 12 between the intermetallic layer 22 and contact pad 12.

In order to ensure almost complete conversion of the copper in the top layer of the under-bump metallurgy to the copper/tin intermetallic, reflow preferably takes place for 1-2 minutes above the melting point of the solder. The unconverted copper in the phased chromium-copper region prevents detachment of the solder bumps from the chromium adhesion layer, and thereby enhances structural integrity. During reflow, solder dams 18 prevent lateral spread and bridging of the solder and thereby control the size of the solder bump base. Reflow may be performed in air or in an inert ambient such as nitrogen, typically with flux applied, or in a reducing ambient such as hydrogen, without flux. As is well known to those having skill in the art, flux residues, if present, should be cleaned prior to etching the solder dam 18 and the under-bump metallurgy 16.

As also shown in FIG. 4, there is a lateral reaction between the solder 20 and the under-bump metallurgy 16 during reflow. Accordingly, the intermetallic layer formed underneath each bump includes a lip or ridge 26 which typically extends several microns from the bump. This lip or ridge may be used to identify solder bumps formed according to the present invention, because lateral reaction with the under-bump metallurgy cannot take place if all under-bump metallurgy between the contact pads is removed prior to reflow. This lip or ridge 26 also provides an added degree of protection for the base of the solder bump. An improved performance solder bump is thereby provided.

Figure 5:
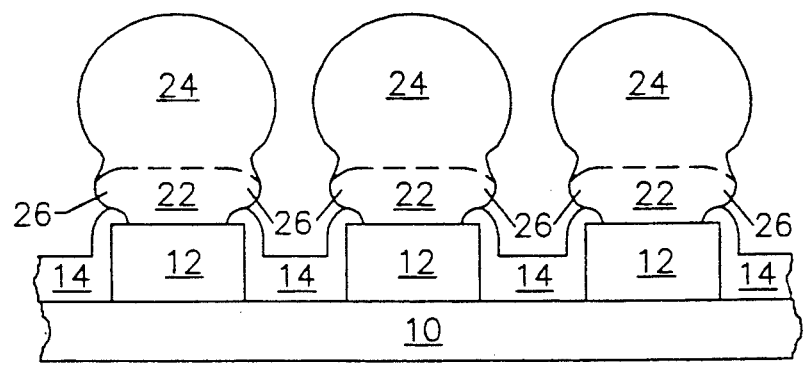

Referring now to FIG. 5, the solder dam 18 and the under-bump metallurgy 16 between the contact pads 12 are removed, while preserving the base of the reflowed solder bumps 24. Since the top copper layer of the under-bump metallurgy between solder bump 24 and contact pad 12 has been converted into an intermetallic layer, the solder dams and the remaining under-bump metallurgy between contact pads 12 may be removed, without substantially removing the intermetallic. An etchant or etchants are used which etch the intermetallic 22 much more slowly than solder dam 18 and under-bump metallurgy 16. Preferably, the etchants do not etch the intermetallic 22 while removing solder dams 18 and intermetallic 22.

For example, for chromium solder dams 18, a hydrochloric acid based etchant such as Transene CRE473 is an effective etchant, and a mixture of ammonium hydroxide and a trace amount of hydrogen peroxide is an effective copper etchant. Contact to the metal surface in the substrate with a zinc rod may be required to initiate etching of chromium. When titanium is used as a solder dam, a mixture of ammonium hydroxide and hydrogen peroxide (typically higher peroxide concentrations than in the copper etchant) is effective. Multiple etch cycles may be needed to remove the phased chromium copper layer and the bottom chromium layer. Neither of these etchants is effective against the copper/tin intermetallic and neither of these etchants attacks solder to a detectable extent. It will be understood by those having skill in the art that during copper etching, the device may be left in the etchant for as long as necessary to completely remove the copper between the bumps. It will also be understood by those having skill in the art that other etchants may be used, and other removal processes may be used.

Figure 6:
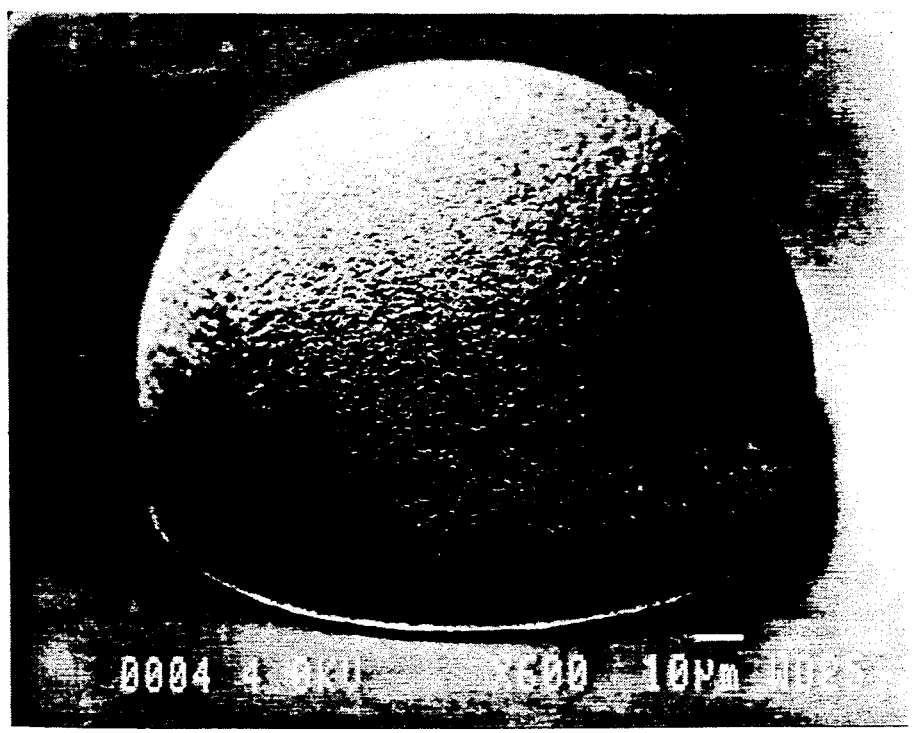
FIG. 6 is a scanning electron microscope photograph of a solder bump formed according to the present invention.

Accordingly, an improved solder bump fabrication process is provided. Imperfections in photolithographic processing of thick film photoresists also do not degrade alignment. Moreover, undercutting of the solder bump base during under-bump metallurgy etching is substantially reduced or eliminated. The base geometry of the solder bump is therefore preserved. In fact, the process preferably forms a lip at the base of the solder bump to further protect the solder bump, and enhance electrical and mechanical reliability. FIG. 6 is a scanning electron microscope photograph of a solder bump formed according to the present invention, illustrating solder bump 24, lip 26 and substrate 10.

It will be understood by those having skill in the art that reduced bump base undercutting may be obtained with the present invention, independent of misalignment/distortion reduction, by reflowing the solder prior to removing the under-bump metallurgy between the contact pads. For example, in some microelectronic substrate designs, the designed bump base may be substantially larger than the contact pads, so that alignment of the solder bump to the contact pads is relatively unimportant. Misalignment or distortion of the solder bump relative to the contact pads may be tolerated.

A simplified process which allows misalignment or distortion between the solder bump and the contact pads will now be described. The under-bump metallurgy may contain the same bottom chromium layer, phased chromium/copper layer and top copper layer described above. However, a second chromium layer is added on the top copper layer. A solder accumulation layer, for example thick film photoresist, is formed and patterned as described above. The patterned solder dam layer described above is not formed.

The second chromium layer is then removed in the cavities of the solder accumulation layer, and solder is plated as already described. After removing the solder accumulation layer, the solder is reflowed to form an intermetallic and protect the bump base as already described. The second chromium layer between the contact pads prevents the reflowed solder from bridging. The second chromium layer may be misaligned relative to the contact pads, but this misalignment may be relatively unimportant in view of the substrate design. The base of the solder bump is still protected during etching of the under-bump metallurgy by reflowing prior to removing the under-bump metallurgy between the contact pads.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An interconnection system for a microelectronic substrate comprising:
    a plurality of contact pads on said substrate;
    a older bump on each of said contact pads each solder bump having a circular base on said contact pad; and
    an intermetallic layer between each solder bump and contact pad, said intermetallic layer including a lip which extends beyond the base of the solder bump outwardly over the associated contact pad, to thereby protect the contact pad.

2. The interconnection system of claim 1 wherein said solder bump is a lead-tin solder bump and wherein said intermetallic layer is a copper/tin intermetallic lip.

3. The interconnection system of claim 1 wherein said lip extends outwardly a few microns beyond the base of said solder bump.

4. The interconnection system of claim 1 wherein said solder bump is a spheroidal solder bump on each of said contact pads and wherein said lip is a circular lip which extends beyond the base of the solder bump outwardly over the associated contact pad.

5. An interconnection system for a microelectronic substrate comprising:
    a plurality of contact pads on said substrate;
    a spheroidal solder bump one each of said contact pads having a base on said contact pad; and
    a circular lip on said spheroidal solder bump at the base thereof, extending outwardly from said solder bump over the associated contact pad, to thereby protect the contact pad.

6. The interconnection system of claim 5 wherein said spheroidal solder bump is a spheroidal lead-tin solder bump and wherein said circular lip is a copper/tin intermetallic circular lip.

7. The interconnection system of claim 5 wherein said circular lip extends outwardly a few microns from said solder bump.

* * * * *

UNITED STATES PATENT AND TRADEMARK OFFICE
CERTIFICATE OF CORRECTION

PATENT NO. : 5,293,006
DATED : March 8, 1994
INVENTOR(S) : Yung

It is certified that error appears in the above-identified patent and that said Letters Patent is hereby corrected as shown below:

Column 8, line 1, "older" should be --solder--.

Signed and Sealed this

Sixth Day of September, 1994

Attest:

BRUCE LEHMAN

*Attesting Officer*   *Commissioner of Patents and Trademarks*